(12) United States Patent
You et al.

(10) Patent No.: US 10,777,618 B2
(45) Date of Patent: Sep. 15, 2020

(54) TRANSPARENT DISPLAY PANEL, FABRICATING METHOD FOR THE SAME, AND DISPLAY DEVICE

(71) Applicant: BOE TECHNOLOGY GROUP CO., LTD., Beijing (CN)

(72) Inventors: Juanjuan You, Beijing (CN); Changyen Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/412,812

(22) Filed: May 15, 2019

(65) Prior Publication Data
US 2020/0075681 A1    Mar. 5, 2020

(30) Foreign Application Priority Data

Sep. 3, 2018    (CN) .......................... 2018 1 1019929

(51) Int. Cl.
*H01L 51/56*    (2006.01)
*H01L 27/32*    (2006.01)
(Continued)

(52) U.S. Cl.
CPC ........ *H01L 27/322* (2013.01); *H01L 27/3244* (2013.01); *H01L 51/001* (2013.01);
(Continued)

(58) Field of Classification Search
CPC . H04L 27/322; H04L 27/3244; H04L 51/001; H04L 51/5012; H04L 51/5218; H04L 51/5234; H04L 51/56
See application file for complete search history.

(56) References Cited

U.S. PATENT DOCUMENTS

| 2011/0148944 A1* | 6/2011 | Kobayashi | ........... G09G 3/3225 |
| | | | 345/690 |
| 2012/0169683 A1* | 7/2012 | Hong | .................. H01L 27/3211 |
| | | | 345/206 |

(Continued)

FOREIGN PATENT DOCUMENTS

| CN | 103996696 | 8/2014 |
| CN | 106024835 | 10/2016 |

(Continued)

OTHER PUBLICATIONS

1st Office Action dated Apr. 7, 2020 for Chinese Patent Application No. 201811019929.3.

*Primary Examiner* — Fernando L Toledo
*Assistant Examiner* — Valerie N Newton
(74) *Attorney, Agent, or Firm* — Thomas | Horstemeyer LLP

(57) ABSTRACT

A transparent display panel, a method of fabricating the same, and a display device are provided. The transparent display panel comprises a substrate and a plurality of display units. The display units are arranged in an array on the substrate and comprises a display area and a non-display area, where the display area and the non-display area comprise a white organic electroluminescent unit. The white organic electroluminescent unit of the display area comprises a first electrode and a second electrode, the first electrode being a reflective electrode and the second electrode being a transparent electrode. The white organic electroluminescent unit of the non-display area comprises a third electrode and a fourth electrode, where the third electrode and the fourth electrode are both transparent electrodes.

16 Claims, 3 Drawing Sheets

(51) Int. Cl.
*H01L 51/00* (2006.01)
*H01L 51/50* (2006.01)
*H01L 51/52* (2006.01)

(52) U.S. Cl.
CPC ...... *H01L 51/5012* (2013.01); *H01L 51/5218* (2013.01); *H01L 51/5234* (2013.01); *H01L 51/56* (2013.01); *H01L 2227/323* (2013.01); *H01L 2251/301* (2013.01); *H01L 2251/308* (2013.01); *H01L 2251/5323* (2013.01)

(56) References Cited

U.S. PATENT DOCUMENTS

| 2015/0340655 | A1* | 11/2015 | Lee | H01L 27/322 257/40 |
| 2015/0357384 | A1* | 12/2015 | Li | H01L 27/322 257/40 |
| 2018/0151647 | A1* | 5/2018 | Lee | H01L 21/02008 |
| 2018/0190935 | A1* | 7/2018 | Kim | H01L 51/5234 |

FOREIGN PATENT DOCUMENTS

| CN | 107346778 | 11/2017 |
| KR | 20170003856 | 1/2017 |

* cited by examiner

TRANSPARENT DISPLAY PANEL, FABRICATING METHOD FOR THE SAME, AND DISPLAY DEVICE

CROSS-REFERENCE TO RELATED APPLICATIONS

The present application is based on and claims priority to Chinese Patent Application No. 201811019929.3, filed on Sep. 3, 2018, the entire contents of which are incorporated herein by reference.

TECHNICAL FIELD

The present disclosure relates to the field of display technologies and, in particular, to a transparent display panel, a method fabricating for the same, and a display device.

BACKGROUND

An organic light emitting display (OLED) does not need backlight due to its self-luminous property, so it can be used as a transparent display. One type of the transparent display device in the related art includes both a cathode and anode of luminous pixel adopting a transparent material. As shown in FIG. 1, the transparent display device having high transmittance will cause the brightness at the display side to be significantly reduced, thus reducing contrast of the display panel. Moreover, it is suitable for the luminous pixel of the transparent display device to adopt a side-by-side lighting manner, which requires Fine metal mask (FMM), such that it is not suitable for fabricating a large size display panel.

SUMMARY

The technical problem to be solved by the embodiments of the present disclosure is to provide a transparent display panel, a method of fabricating the same, and a display device, wherein, the transparent display panel is allowed to be fabricated to have a large size.

In order to solve the technical problems described above, an embodiment of the present disclosure provides a transparent display panel including a substrate and display units. The display units are arranged in an array on the substrate and include a display area and a non-display area, wherein, the display area and the non-display area include a white organic electroluminescent unit. The white organic electroluminescent unit of the display area includes a first electrode and a second electrode, the first electrode being a reflective electrode, and the second electrode being a transparent electrode. The white organic electroluminescent unit of the non-display area includes a third electrode and a fourth electrode, the third electrode and the fourth electrode being both transparent electrodes.

Optionally, the first electrode includes a first transparent conductive layer, a metal layer, and a second transparent conductive layer which are sequentially disposed.

Optionally, the second electrode and the fourth electrode are configured into an integral structure.

Optionally, the transparent electrode is made from at least one of indium tin oxide, indium zinc oxide, carbon nanotubes, and graphene.

Optionally, the first transparent conductive layer is made from at least one of indium tin oxide, indium zinc oxide, carbon nanotubes, and graphene.

Optionally, the reflective electrode includes at least one of Ag and AgNd.

Optionally, the display area and the non-display area include a white organic electroluminescent functional layer, where the white organic electroluminescent functional layer of the display area and the white organic electroluminescent functional layer of the non-display area are configured into an integral structure.

Optionally, sub pixels are further disposed on the second electrode at the display area.

Optionally, color films are further disposed on the sub pixels correspondingly, where an orthographic projection of the color film on the substrate and an orthographic projection of the display area on the substrate overlap with each other.

Embodiments of the present disclosure also provide a fabricating method for a transparent display panel, where the transparent display panel includes display units arranged in an array and includes a display area and a non-display area, wherein, the display area and the non-display area include a white organic electroluminescent unit, where the method includes steps as follows:

providing a substrate;
forming a first transparent conductive layer on the substrate;
forming a metal layer on the first transparent conductive layer;
forming a second transparent conductive layer on the metal layer;
removing parts of the metal layer and second transparent conductive layer corresponding to the non-display area;
forming a white organic electroluminescent unit functional layer on the second transparent conductive layer; and
forming a transparent electrode layer on the white organic electroluminescent unit functional layer.

Optionally, the first transparent conductive layer, the second the first transparent conductive layer and the transparent electrode layer are made from at least one of indium tin oxide, indium zinc oxide, carbon nanotubes, and graphene.

Optionally, the metal layer is made from at least one of Ag and AgNd.

Optionally, the white organic electroluminescent unit functional layer is formed by evaporation process.

Optionally, further including forming sub pixels at the display area.

Optionally, further including providing color films on the sub pixels correspondingly.

Embodiments of the present disclosure also provide a display device including the above transparent display panel.

BRIEF DESCRIPTION OF THE DRAWINGS

The accompanying drawings, that are incorporated in and constitute part of the specification, show the embodiments of the present disclosure and are intended to explain the principle of the present disclosure together with the description.

DETAILED DESCRIPTION

Figure 1:
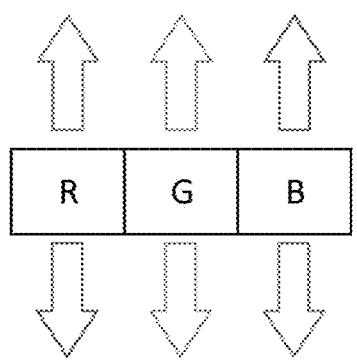
FIG. 1 is a schematic view of a transparent display panel in a related art.

Example embodiments will now be described more fully with reference to the accompanying drawings. However, the example embodiments can be embodied in a variety of forms, and should not be construed as being limited to the embodiment set forth herein. To the contrary, these embodiments are provided so that this disclosure will be thorough and complete and such that the concepts of the example embodiments are fully conveyed to those skilled in the art. In the drawings, the thickness of the area and layer is exaggerated for clarity.

Figure 2:
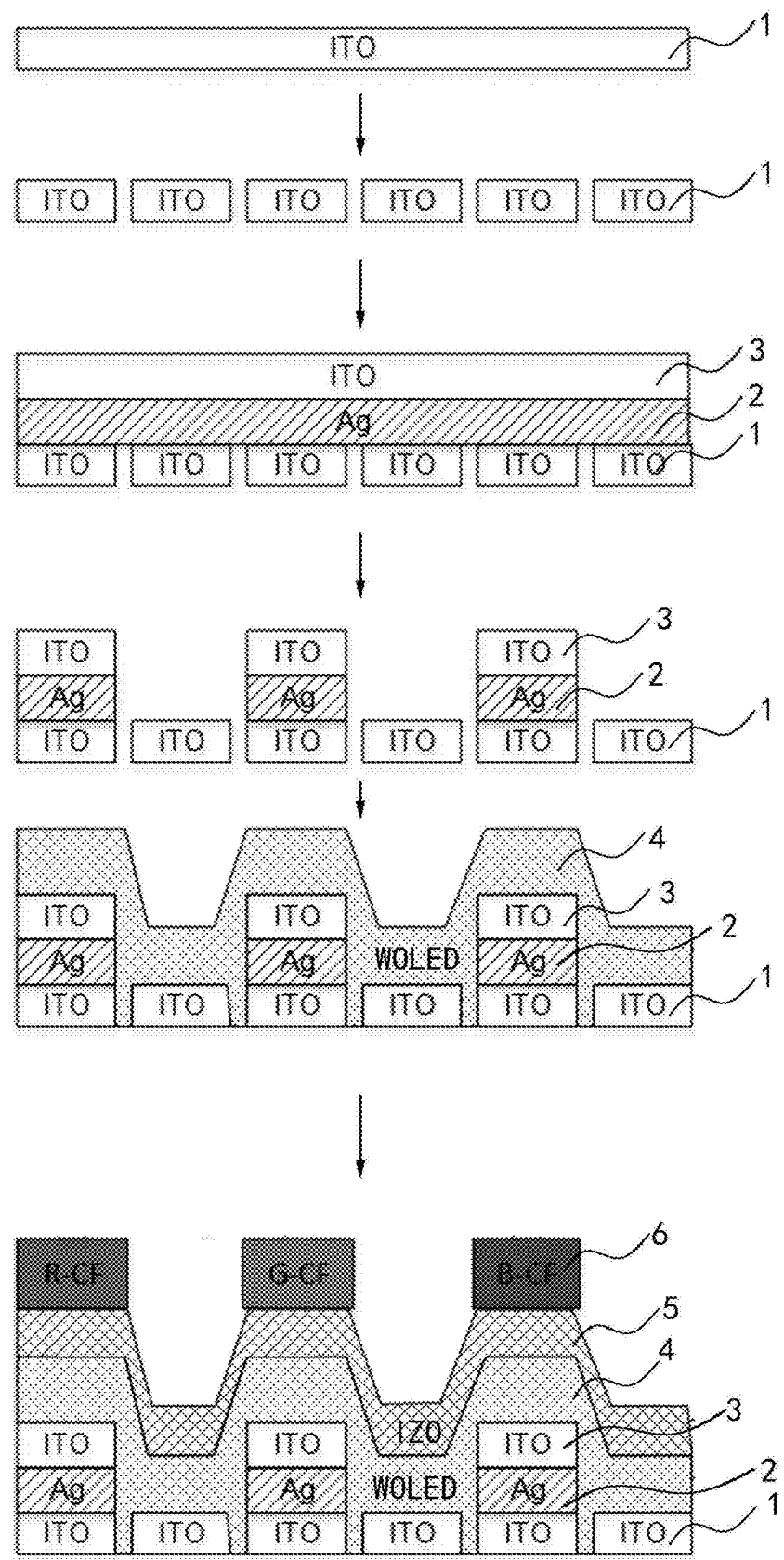
FIG. 2 is a flow chart of a fabricating process for a transparent display panel according to the present disclosure.

In FIG. 2, a flow chart is shown of a fabricating process for a transparent display panel. First, a substrate (not shown in the drawings) having a TFT array is provided. A transparent conductive layer 1 is formed on the substrate having the TFT array. The transparent conductive layer 1 is a transparent electrode. In the present embodiment, ITO is taken as an example. However, the person skilled in the art would understand that the transparent electrode may be any suitable transparent electrode, which is not limited to the ITO electrode. The transparent conductive layer 1 plays a function of protecting reflective electrode, enhancing adhesive force between the substrate, and improving conductivity. The purpose of the present description could be achieved if the transparent conductive layer 1 is not adopted. The transparent conductive layer 1 is divided into a display part and non-display part by etching. The non-display part is used as a third electrode of the non-display area.

A metal layer 2 is formed on the transparent conductive layer 1 (as shown in FIG. 2 in which the pattering process is finished). The metal layer 2 may be Ag or AgNd alloy. In the drawings, an Ag layer is taken as an example.

Thereafter, a second transparent conductive layer 3 is formed on the metal layer 2.

After that, parts of the metal layer 2 and second transparent conductive layer 3 corresponding to the non-display area are removed by a suitable manner, such as chemical etching or laser etching. The transparent conductive layer 1, metal layer 2 and second transparent conductive layer 3 at the display area are reserved to act as a first electrode (reflective electrode) of a white organic electroluminescent (WOLED) unit of the display area.

In the present embodiment, the first electrode of the WOLED unit of the display area is a pixel electrode of the display area.

In the present embodiment, parts of the metal layer 2 corresponding to the non-display area are removed after the metal layer 2 is formed. Then, the second transparent conductive layer 3 is formed, and then, parts of the second transparent conductive layer corresponding to the non-display area are removed.

In the present embodiment, the transparent conductive layer 1, the metal layer 2, and the second transparent conductive layer 3 are deposited subsequently, and the first electrode and third electrode are formed by one patterning process.

In the present embodiment, the transparent conductive layer 1 and the metal layer 2 are deposited subsequently. During a patterning process, parts of the transparent conductive layer 1 and the metal layer 2 corresponding to the display area are reserved. For instance, a corresponding position of the non-display area only the transparent conductive layer 1 is reserved, and then, the second transparent conductive layer 3 is deposited and treated with a patterning process so as to be only reserved at a corresponding position of the display area, thereby forming the first electrode (reflective electrode) with a combination of the first transparent conductive layer 1 at the lower layer and metal layer. Alternatively, the second transparent conductive layer 3 is treated with a patterning process so as to be reserved at display area and non-display area, which could improve flatness of the display panel.

The first transparent conductive layer 1 and the second transparent conductive layer 3 may be made from the same material or a different material. The transparent electrode may be made from at least one of ITO, IZO, carbon nanotubes, graphene, or the like. In FIG. 2, ITO is taken an example as the first transparent conductive layer 1 and the second transparent conductive layer 3.

After that, a WOLED functional layer 4 is formed on the ITO electrode layer (the second transparent conductive layer 3), such as by an evaporation process. The WOLED functional layer 4 may include one or more layers from the hole injection layer, hole transport layer, light-emitting layer, electron transport layer, electron injection layer, which is limited thereto.

Then, a transparent electrode layer 5 is formed on the WOLED functional layer 4. The transparent electrode layer 5 may be IZO or other transparent conductive layer which is suitable to be a transparent electrode. The transparent electrode layer 5 is used as a second electrode of WOLED unit of the display area and fourth electrode of WOLED unit of the non-display area simultaneously.

Then, RGB sub pixels are formed on the transparent electrode layer 5.

Finally, color films 6 are formed on the RGB sub pixels correspondingly. The orthographic projection of the color film on the substrate and the orthographic projection of the display area on the substrate overlap with each other, either completely overlapping or partially overlapping, as long as meeting the requirements for a RGB normal display.

In the present description, the non-display area is used for complementary color for adjacent pixels, so as to increase the brightness of the display area. Therefore, in the transparent panel, the arrangement manner of W (denoting non-display area) and sub pixel may adopt any manner as long as achieving the display and increasing brightness. FIG. 2 shows an arrangement manner of such: sub pixel R/W/sub pixel G/W/sub pixel B/W. The arrangement manner is not limited thereto. For instance, any other manner may be adopted as long a complementary color, improved brightness, such as sub pixel R/W/sub pixel G/sub pixel B, sub pixel R/sub pixel G/W/sub pixel B, sub pixel R/sub pixel G/sub pixel B/W, or the like are achieved.

Figure 3:
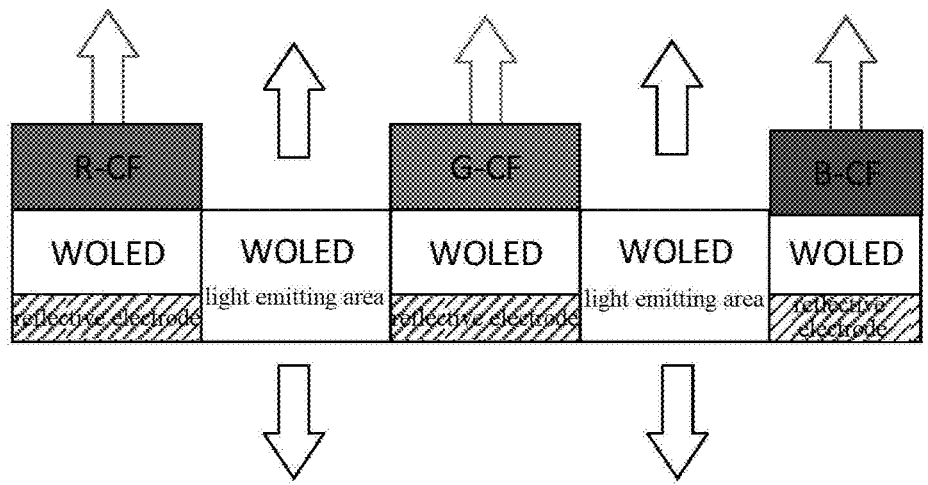
FIG. 3 is a schematic view of a transparent display panel according to the present disclosure.

FIG. 3 shows a schematic view of a transparent display panel fabricated by the process described above. As shown in FIG. 3, a display includes a display area and a non-display area. In the present description, the display area refers to an area having pixel and used for displaying image; and the non-display area refers to an area only emitting white light without displaying image, i.e., without a pixel.

Both the display area and non-display area include a white organic electroluminescent (WOLED) unit. The WOLED unit of the display area is provided with a first electrode and a second electrode. The first electrode is a reflective electrode and the second electrode is a transparent electrode. The WOLED unit of the non-display area is provided with a third electrode and a fourth electrode. The third electrode and fourth electrode are transparent electrodes. The WOLED unit may be any WOLED unit, such as white light device with single light emitting layer or multiple light emitting layers. The second electrode and the fourth electrode may be an integral structure. The reflective electrode may be an Ag electrode, AgNd electrode, or the like. The transparent electrode may include ITO, IZO, carbon nanotubes, graphene, or the like. RGB color films are disposed on the RGB sub pixels correspondingly.

In the transparent display panel of the present description, both display area and non-display area include WOLED, therefore, there is no need to use FMM during fabrication, such that a panel in large size could be fabricated.

Further, light emitted from the non-display area of the transparent display panel could emit or inject into adjacent illuminating pixels from side, which could provide complementary color for adjacent pixels, this improving luminous efficiency from a front surface and reducing power consumption.

Figure 4:
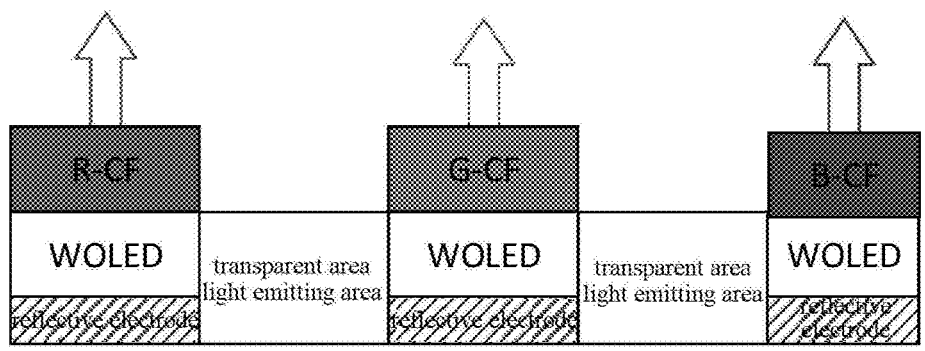
FIG. 4 is a schematic view of a transparent display panel in a comparative example.

Concerning the fabrication for a transparent display panel in a comparative example, a display area of the present embodiment and a non-display area made of transparent material are shown in FIG. 4. Compared with the transparent panel in the comparative example, the light extraction efficiency of the transparent panel in the present embodiment is increased to about 5/12.

Compared with related art, the light emitting unit of the transparent panel in the present disclosure is fabricated by a WOLED process, such that the display panel could be configured in large size without need of FMM. In addition, in the present disclosure, light emitted from the non-display area of the transparent display panel could emit or inject into adjacent pixels from the side, which could provide complementary color for adjacent pixels, thereby reducing power consumption and improving luminous efficiency in the display area.

The present disclosure also provides a display device including the above transparent display panel, which may include, but is not limited to, a liquid crystal panel, an electronic paper, a mobile phone, a tablet computer, a television, a display, a notebook computer, a digital photo frame, a navigator, and the like, or any display product or component.

The embodiments disclosed in the present disclosure are as described above, but are merely used to facilitate the understanding of the present disclosure, and are not intended to limit the present disclosure. Any modification or variation in the form and details of the implementation may be made by those skilled in the art without departing from the spirit and scope of the disclosure. However, the protection and scope of the present disclosure should still be defined by the appended claims.

What is claimed is:

1. A transparent display panel, comprising:
a substrate; and
a plurality of display units arranged in an array on the substrate, the display units comprising a display area and a non-display area, wherein the display area and the non-display area comprise a white organic electroluminescent unit, wherein:
the white organic electroluminescent unit of the display area comprises a first electrode and a second electrode, the first electrode being a reflective electrode and the second electrode being a transparent electrode;
the white organic electroluminescent unit of the non-display area comprises a third electrode and a fourth electrode, the third electrode and the fourth electrode both being transparent electrodes; and
the first electrode and the third electrode are different but are formed of a same material, the same material being indium tin oxide (ITO).

2. The transparent display panel according to claim 1, wherein the first electrode comprises a first transparent conductive layer, a metal layer, and a second transparent conductive layer which are sequentially disposed.

3. The transparent display panel according to claim 1, wherein the second electrode and the fourth electrode are configured into an integral structure.

4. The transparent display panel according to claim 1, wherein the transparent electrode is made from at least one of indium tin oxide, indium zinc oxide, carbon nanotubes, and graphene.

5. The transparent display panel according to claim 2, wherein the first transparent conductive layer is made from at least one of indium tin oxide, indium zinc oxide, carbon nanotubes, and graphene.

6. The transparent display panel according to claim 1, wherein the reflective electrode comprises at least one of Ag and AgNd.

7. The transparent display panel according to claim 1, wherein:
the display area and the non-display area comprise a white organic electroluminescent functional layer; and
the white organic electroluminescent functional layer of the display area and the white organic electroluminescent functional layer of the non-display area are configured into an integral structure.

8. The transparent display panel according to claim 1, wherein sub pixels are disposed on the second electrode at the display area.

9. The transparent display panel according to claim 8, wherein:
color films are disposed on the sub pixels correspondingly; and
an orthographic projection of the color film on the substrate and an orthographic projection of the display area on the substrate overlap each other.

10. A fabricating method for a transparent display panel, the transparent display panel comprising display units arranged in an array and further comprising a display area and a non-display area, wherein the display area and the non-display area comprise a white organic electroluminescent unit, the fabricating method comprising:
providing a substrate;
forming a first transparent conductive layer on the substrate;
forming a metal layer on the first transparent conductive layer;
forming a second transparent conductive layer on the metal layer;
removing parts of the metal layer and second transparent conductive layer corresponding to the non-display area;
forming a white organic electroluminescent unit functional layer on the second transparent conductive layer; and
forming a transparent electrode layer on the white organic electroluminescent unit functional layer.

11. The fabricating method according to claim 10, wherein the first transparent conductive layer, the second transparent conductive layer, and the transparent electrode layer are made from at least one of indium tin oxide, indium zinc oxide, carbon nanotubes, and graphene.

12. The fabricating method according to claim 10, wherein the metal layer is made from at least one of Ag and AgNd.

13. The fabricating method according to claim 10, wherein the white organic electroluminescent unit functional layer is formed by an evaporation process.

14. The fabricating method according to claim 10, further comprising forming sub pixels at the display area.

15. The fabricating method according to claim 14, further comprising providing color films on the sub pixels correspondingly.

16. A display device, comprising:
a transparent display panel comprising:
   a substrate; and
   a plurality of display units, arranged in an array on the substrate and comprising a display area and a non-display area, wherein, the display area and the non-display area comprise a white organic electroluminescent unit, wherein:
      the white organic electroluminescent unit of the display area comprises a first electrode and a second electrode, the first electrode being a reflective electrode and the second electrode being a transparent electrode;
      the white organic electroluminescent unit of the non-display area comprises a third electrode and a fourth electrode, the third electrode and the fourth electrode both being transparent electrodes; and
      the first electrode and the third electrode are different but are formed of a same material, the same material being indium tin oxide (ITO).

\* \* \* \* \*